United States Patent
Mizuta

(10) Patent No.: US 12,125,718 B2
(45) Date of Patent: Oct. 22, 2024

(54) BONDING APPARATUS AND METHOD OF MANUFACTURING SEMICONDUCTOR DEVICE

(71) Applicant: Kioxia Corporation, Tokyo (JP)

(72) Inventor: Yoshio Mizuta, Yokkaichi Mie (JP)

(73) Assignee: Kioxia Corporation, Tokyo (JP)

(*) Notice: Subject to any disclaimer, the term of this patent is extended or adjusted under 35 U.S.C. 154(b) by 0 days.

(21) Appl. No.: 17/694,019

(22) Filed: Mar. 14, 2022

(65) Prior Publication Data

US 2023/0091517 A1 Mar. 23, 2023

(30) Foreign Application Priority Data

Sep. 17, 2021 (JP) .................. 2021-152246

(51) Int. Cl.
- *H01L 21/67* (2006.01)
- *B32B 37/00* (2006.01)
- *H01L 21/683* (2006.01)

(52) U.S. Cl.
CPC .... *H01L 21/67092* (2013.01); *B32B 37/0046* (2013.01); *H01L 21/6838* (2013.01); *B32B 2457/14* (2013.01)

(58) Field of Classification Search
CPC ........... H01L 21/67092; H01L 21/6838; H01L 21/185; H01L 21/67121; H01L 21/67132; B32B 37/0046; B32B 38/1841; B32B 38/1858; B32B 2457/14
See application file for complete search history.

(56) References Cited

U.S. PATENT DOCUMENTS

| | | | |
|---|---|---|---|
| 10,438,918 B2 | 10/2019 | Omori et al. | |
| 2019/0096735 A1* | 3/2019 | Liao | H01L 21/6838 |
| 2019/0189593 A1* | 6/2019 | Kim | H01L 21/681 |
| 2020/0055296 A1* | 2/2020 | Kim | H01L 21/67092 |
| 2020/0365442 A1 | 11/2020 | Sugakawa et al. | |

FOREIGN PATENT DOCUMENTS

| | | |
|---|---|---|
| JP | 2016039364 A | 3/2016 |
| JP | 2018026415 A | 2/2018 |
| JP | 2018190826 A | 11/2018 |
| JP | 6727069 B2 | 7/2020 |
| JP | 2020120138 A | 8/2020 |
| JP | WO2019142708 A1 | 8/2020 |
| TW | 201622028 A | 6/2016 |
| TW | I594308 B | 8/2017 |

* cited by examiner

*Primary Examiner* — Alex B Efta
*Assistant Examiner* — Alexander S Wright
(74) *Attorney, Agent, or Firm* — Holtz, Holtz & Volek PC

(57) ABSTRACT

A bonding apparatus according to an embodiment includes a first chuck, a second chuck, and a pushpin arranged in a center portion of the second chuck. The first chuck includes a first area and a second area in a plane view. The first chuck includes a first rib arranged to divide the first area and the second area from each other in the plane view. The first area includes an area that overlaps the pushpin in the plane view. The second area encircles an outer perimeter of the first area in the plane view. The first chuck has a plurality of pins arranged at intervals in the second area, and has no pin in the area of the first area that overlaps the pushpin in the plane view.

10 Claims, 11 Drawing Sheets

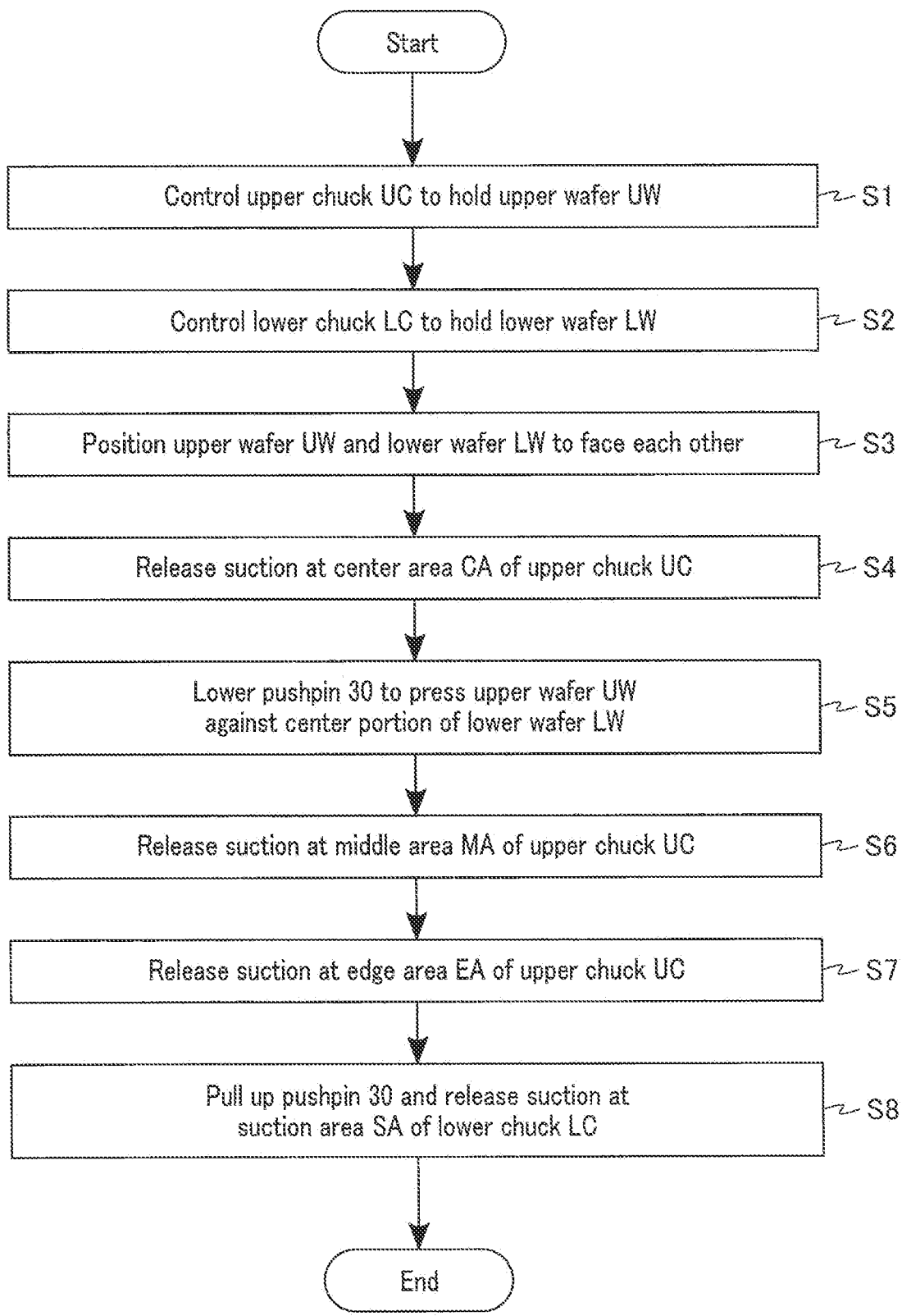
F I G. 5

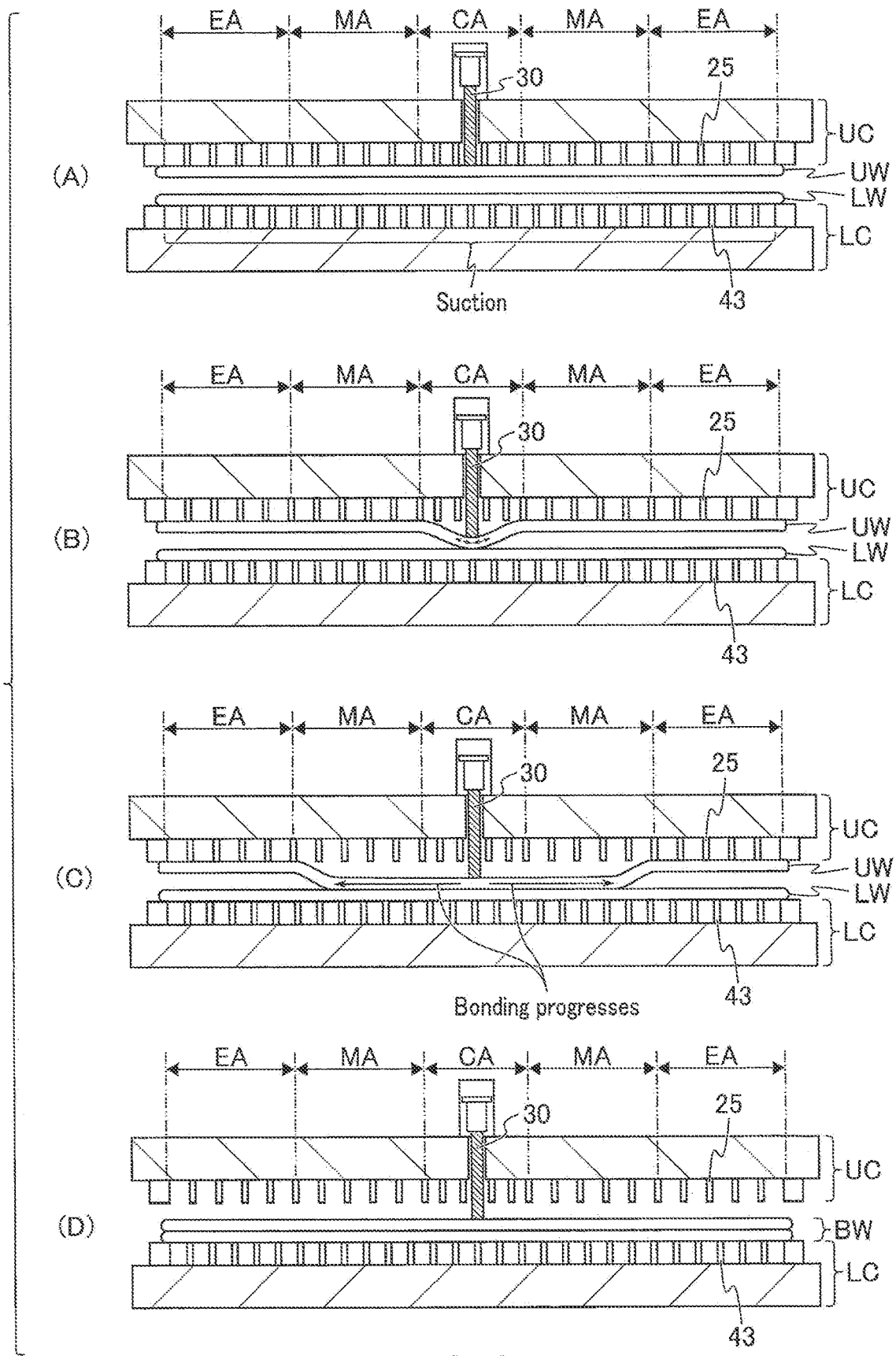
F I G. 6

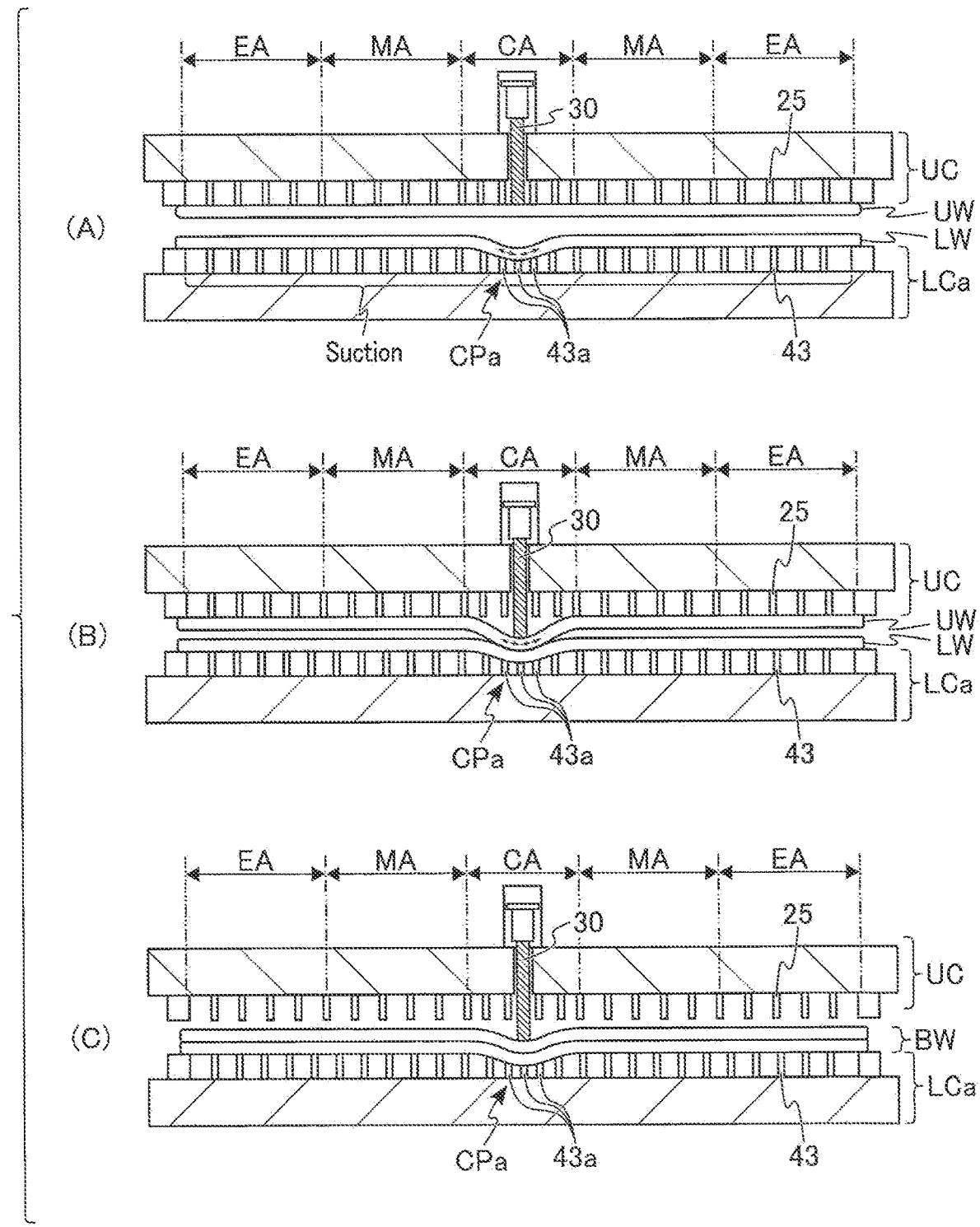
F I G. 9

BONDING APPARATUS AND METHOD OF MANUFACTURING SEMICONDUCTOR DEVICE

CROSS-REFERENCE TO RELATED APPLICATIONS

This application is based upon and claims the benefit of priority from Japanese Patent Application No. 2021-152246, filed Sep. 17, 2021, the entire contents of which are incorporated herein by reference.

FIELD

Embodiments described herein relate generally to a bonding apparatus and a method of manufacturing a semiconductor device.

BACKGROUND

A three-dimensional layer stacking technique has been known, with which semiconductor circuit substrates are three-dimensionally stacked.

BRIEF DESCRIPTION OF THE DRAWINGS

FIG. 5 is a flowchart showing an exemplary bonding process performed by the bonding apparatus according to the first embodiment.

FIG. 6 is a schematic diagram showing an exemplary bonding process performed by a bonding apparatus according to a comparative example.

FIG. 9 is a schematic diagram showing an exemplary bonding process performed by the bonding apparatus according to the second embodiment.

DETAILED DESCRIPTION

Figure 1:
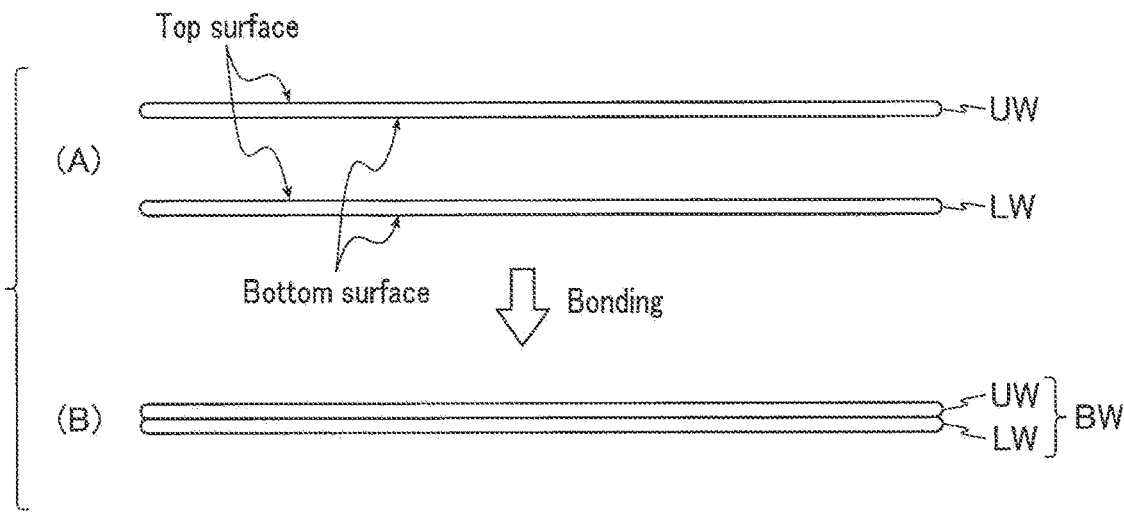
FIG. 1 is a side view showing exemplary states of two wafers before and after bonding conducted by a bonding apparatus.

In general, according to one embodiment, a bonding apparatus is configured to perform a bonding process for bonding a first surface of a first substrate and a second surface of a second substrate to each other. The bonding apparatus includes a first chuck, a second chuck, and a pushpin. The first chuck is configured to hold a third surface of the first substrate, which is a surface opposite the first surface of the first substrate. The second chuck is configured to hold a fourth surface of the second substrate, which is a surface opposite the second surface of the second substrate. The second chuck is configured to be arranged above the first chuck. The pushpin is arranged in a center portion of the second chuck and has a tip end extending in a first direction. The pushpin is configured to move up and down in the first direction. The first chuck includes a first area and a second area in a plane view. The first chuck further includes a first rib arranged to divide the first area and the second area from each other in the plane view. The first area includes an area that overlaps the tip end of the pushpin in the plane view. The second area encircles an outer perimeter of the first area in the plane view. The first chuck has a fifth surface facing the second chuck. The fifth surface of the first chuck has a plurality of pins arranged at intervals in the second area, and has no pin in the area of the first area that overlaps the tip end of the pushpin in the plane view.

The embodiments will be explained below by referring to the drawings. The embodiments exemplify a device, apparatus and method that realize the technical concept of the invention. The drawings are provided merely for schematic or conceptual purposes, and thus may not be identical to the actual dimensions and proportions. To enhance the visibility of the drawings, part of each configuration may be suitably omitted. Hatch patterns may not relate to the materials or properties of the structural components. Throughout this specification, the X, Y, and Z directions are mutually intersecting. Furthermore, structural components having basically the same functions and structures are referred to by the same reference symbols. The reference symbols may contain a character string or the like, which is to distinguish similar components having the same reference symbols, from each other.

[1] First Embodiment

A bonding apparatus 1 according to the first embodiment will be explained below. The bonding apparatus 1 according to the first embodiment is employed to bond two semiconductor circuit substrates. This apparatus is configured to improve the overlay of the two semiconductor circuit substrates. In this specification, a semiconductor circuit substrate will be referred to as a "wafer". Of the two wafers to be bonded by the bonding apparatus 1, the wafer placed on the bottom side will be referred to as a "lower wafer LW", and the wafer placed on the top side will be referred to as an "upper wafer UW". The top and bottom are defined with respect to the Z direction. The "back surface" of the wafer corresponds to a surface of the wafer opposite to the front surface thereof.

[1-1] Overview of Bonding Apparatus 1

FIG. 1 is a side view showing exemplary states of two wafers before and after bonding conducted by the bonding apparatus 1. (A) and (B) in FIG. 1 respectively correspond to the states before and after the bonding. As illustrated in (A) of FIG. 1, the bonding apparatus 1 positions the upper wafer UW and lower wafer LW in such a manner as to face each other. The top surface of the upper wafer UW is actually the back surface of the upper wafer UW, and is held by the bonding apparatus 1. The bottom surface of the upper wafer UW is actually the front surface of the upper wafer UW, which serves as a bonding surface. The front surface and back surface of the upper wafer UW oppose each other. The top surface of the lower wafer LW is the front surface of the lower wafer LW, which serves as a bonding surface. The bottom surface of the lower wafer LW is the back surface of the lower wafer LW, and is held by the bonding apparatus 1. The front surface and back surface of the lower wafer LW oppose each other. Thereafter, the bonding apparatus 1 aligns the overlaying positions of the upper wafer UW and the lower wafer LW. Then, as illustrated in (B) of FIG. 1, the bonding apparatus 1 bonds together the bottom surface (bonding surface) of the upper wafer UW and the top surface (bonding surface) of the lower wafer LW.

In this specification, the two bonded wafers will be referred to as a "bonded wafer BW". A Bonded wafer BW includes semiconductor devices such as NAND-type flash memory devices. When the semiconductor devices are NAND-type flash memory devices, control circuits or the like may be arranged on the lower wafer LW, while memory cells or the like may be arranged on the upper wafer UW. The bonding process will be described in detail later.

[1-2] Configuration of Bonding Apparatus 1

Figure 2:
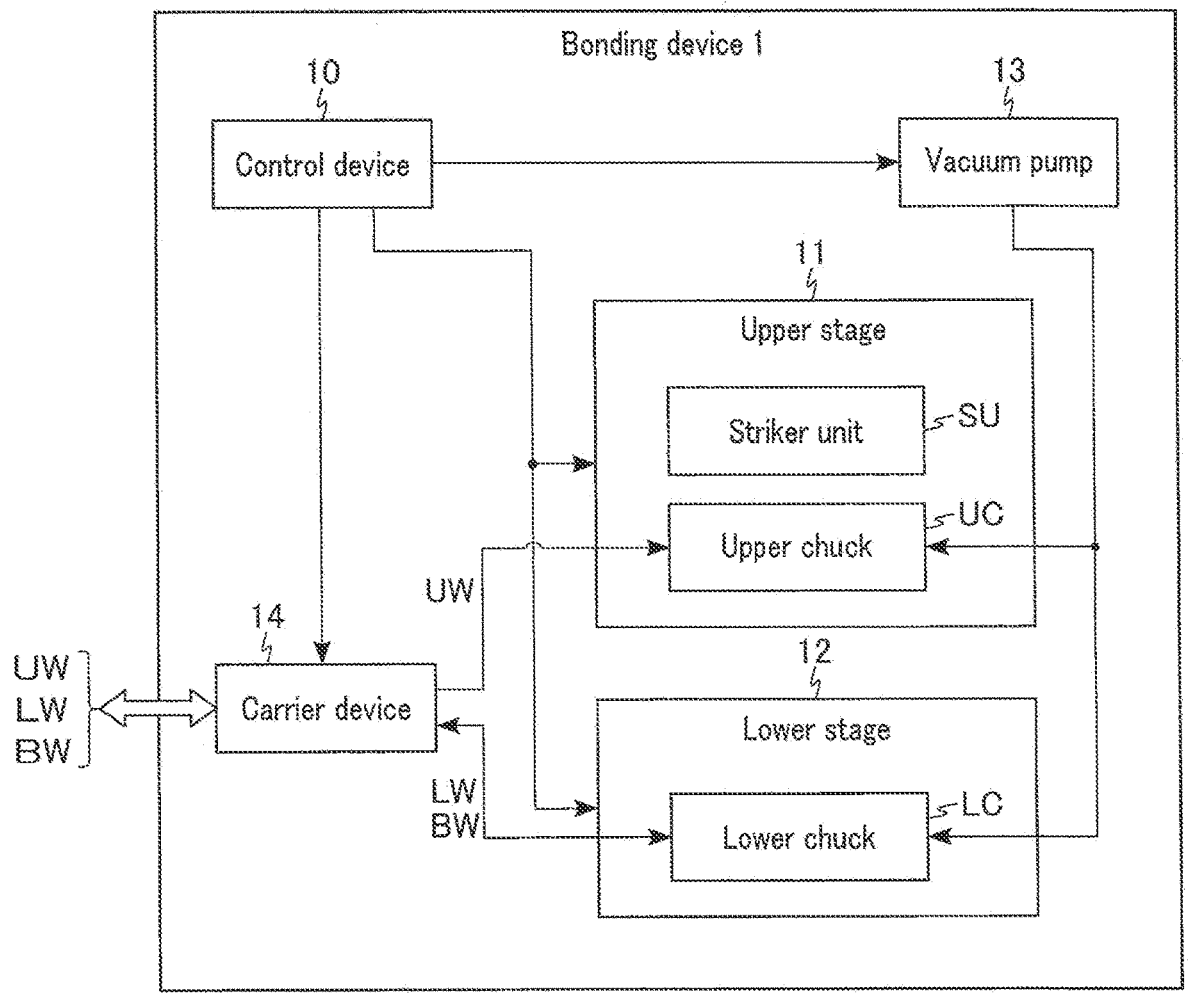
FIG. 2 is a block diagram showing an exemplary configuration of the bonding apparatus according to the first embodiment.

FIG. 2 is a block diagram showing an exemplary configuration of the bonding apparatus 1 according to the first embodiment. As illustrated in FIG. 2, the bonding apparatus 1 includes, for example, a control device 10, an upper stage 11, a lower stage 12, a vacuum pump 13, and a carrier device 14.

The control device 10 is a computer or the like that controls the overall operation of the bonding apparatus 1. The control device 10 controls each of the upper stage 11, lower stage 12, vacuum pump 13, and carrier device 14. The control device 10 includes, for example, a central processing unit (CPU), a read only memory (ROM), a random access memory (RAM), and the like, although these are not illustrated. The CPU is a processor configured to execute various programs relating to the control of the bonding apparatus 1. The ROM is a nonvolatile storage device configured to store the control programs of the bonding apparatus 1. The RAM is a volatile storage device used as a work area of the CPU. The control device 10 may execute a program installed from an externally connected storage medium.

The upper stage 11 is a wafer stage having a function of holding the upper wafer UW and a function of adjusting the position of the upper stage 11. The upper stage 11 includes an upper chuck UC and a striker unit SU. The upper chuck UC is a wafer chuck such as a pin chuck, having a function of fixing (holding) the wafer through vacuum suction. The upper chuck UC holds the upper wafer UW through vacuum suction by the bottom side of the upper chuck UC. The striker unit SU is a device having a function of pushing the center portion of the top surface of the upper wafer UW held by the upper chuck UC.

The lower stage 12 is a wafer stage having a function of holding the lower wafer LW and a function of adjusting the position of the lower stage 12. The lower stage 12 includes a lower chuck LC. The lower chuck LC is a wafer chuck such as a pin chuck, having a function of fixing (holing) the wafer through vacuum suction. The lower chuck LC holds the lower wafer LW through vacuum suction by the top side of the upper chuck UC. The upper stage 11 and lower stage 12 are configured to position the upper wafer UW held by the upper chuck UC and the lower wafer LW held by the lower chuck LC in such a manner as to face each other. In other words, the upper chuck UC can be positioned above the lower chuck LC.

The vacuum pump 13 has a function of discharging air. The vacuum pump 13 is connected to at least one suction port provided in each of the upper chuck UC and lower chuck LC. Under the control of the control device 10, the vacuum pump 13 performs vacuuming independently upon different areas through the suction ports.

The carrier device 14 includes at least one carrier arm for carrying a wafer, a transition for temporarily placing multiple wafers, and the like. The carrier device 14 handles upper wafers UW, lower wafers LW, and bonded wafers BW. For instance, the carrier device 14 carries an upper wafer UW and a lower wafer LW received from an external preprocessing device to the upper chuck UC and lower chuck LC, respectively. The carrier device 14 also carries a bonded wafer BW held by the lower chuck LC after the bonding process, to the outside of the bonding apparatus 1. The carrier device 14 may be provided with a mechanism for turning a wafer over.

The above-mentioned "preprocessing device" is configured to perform reforming and hydrophilic treatments upon the bonding surfaces of the upper wafer UW and lower wafer LW before the bonding process of the bonding apparatus 1 so that the bonding surfaces become suitable for bonding. In brief, the preprocessing device first conducts plasma processing upon the front surfaces of the upper wafer UW and lower wafer LW to reform the front surfaces. In the plasma processing, oxygen ions or nitrogen ions are generated under a predetermined reduced-pressure atmosphere from oxygen gas or nitrogen gas, which serves as a processing gas, and the generated oxygen ions or nitrogen ions are irradiated upon the bonding surface of each wafer. Thereafter, the preprocessing device supplies purified water onto the front surfaces of the upper wafer UW and lower wafer LW. This attaches hydroxyl to the front surfaces of the upper wafer UW and lower wafer LW, as a result of which the front surfaces become hydrophilic. In the bonding process of the bonding apparatus 1, an upper wafer UW and lower wafer LW with such a reformed and hydrophilic bonding surface are used. The bonding apparatus 1 may be combined with a preprocessing device or the like into a bonding system.

(Configuration of Upper Chuck UC)

Figure 3:
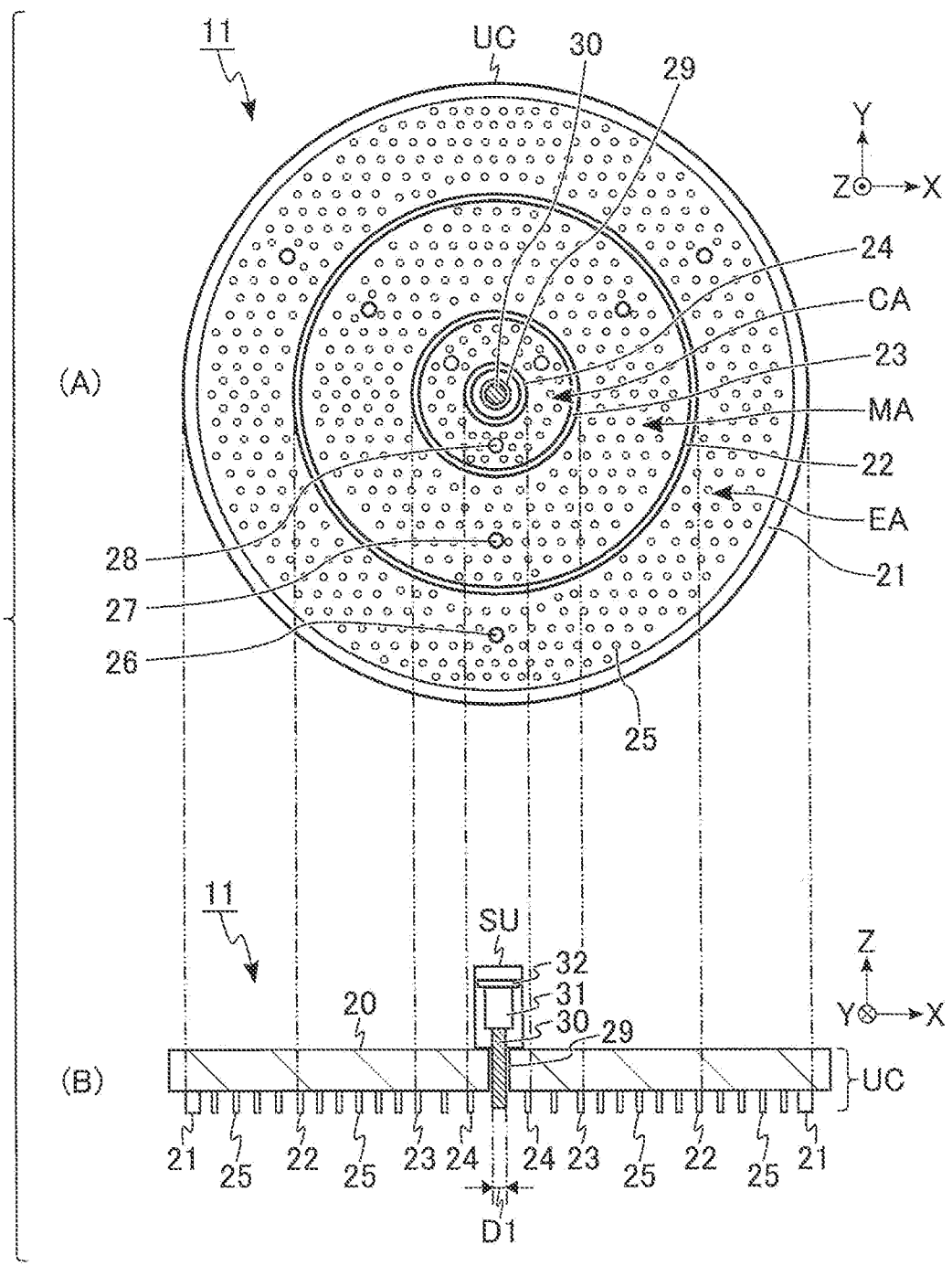
FIG. 3 is a schematic diagram showing an exemplary configuration of an upper chuck and a striker unit included in the bonding apparatus according to the first embodiment.

FIG. 3 is a schematic diagram showing an exemplary configuration of the upper chuck UC and striker unit SU included in the bonding apparatus according to the first embodiment. (A) in FIG. 3 shows a planar layout of the upper chuck UC and striker unit SU, and (B) in FIG. 3 shows a cross-sectional structure of the upper chuck UC and striker unit SU. As illustrated in FIG. 3, the upper chuck UC includes a body part 20. The diameter of the body part 20 is larger than that of the upper wafer UW in the plane view. In the body part 20, ribs 21, 22, 23, and 24, a plurality of pins 25, a plurality of suction ports 26, 27, and 28, and a through hole 29 are provided. The striker unit SU has a pushpin 30, an actuator part 31, and a drive part 32.

The ribs 21, 22, 23, and 24 and pins 25 are provided on the bottom surface of the body part 20. The bottom surface of the body part 20 serves as the holding surface of the upper chuck UC. The ribs 21, 22, 23, and 24 and pins 25 have approximately the same height. The ribs 21, 22, 23, and 24 may be concentrically arranged. Specifically, each of the ribs 21, 22, 23, and 24 is circularly formed. The rib 21 is arranged in the peripheral portion of the body part 20, the diameter of the rib 22 is smaller than that of the rib 21, the diameter of the rib 23 is smaller than that of the rib 22, and the diameter of the rib 24 is smaller than that of the rib 23.

The area defined between the ribs 21 and 22 will be referred to as an "edge area EA", the area defined between the ribs 22 and 23 will be referred to as a "middle area MA", and the area defined between the ribs 23 and 24 will be referred to as a "center area CA". Each of the edge area EA, middle area MA, and center area CA may be referred to as a "suction area". As illustrated in (A) of FIG. 3, it is preferable that the upper chuck UC contain a plurality of suction areas from its inner radius toward the outer radius. Each suction area may be sub-divided, or may have some other shape.

The pins 25 are arranged over the center area CA, middle area MA, and edge area EA, and are separated from each other. The arrangement of pins 25 may be suitably changed. Each of the suction ports 26, 27, and 28 is independently connected to the vacuum pump 13. Each of the suction ports 26, 27, and 28 is connected to the bottom side of the upper chuck UC. A plurality of suction ports 26 are arranged in the edge area EA, a plurality of suction ports 27 are arranged in the middle area MA, and a plurality of suction ports 28 are arranged in the center area CA. At least one suction port may be provided in each suction area.

The through hole 29 is arranged in the center portion of the body part 20, which is an area surrounded by the center area CA, as illustrated in (A) of FIG. 3. The through hole 29 is formed to penetrate the body part 20 along the Z direction, as illustrated in (B) of FIG. 3. The center portion of the body part 20 is configured to face the center portion of the upper wafer UW held by the upper chuck UC. The through hole 29 is formed such that the tip end of the pushpin 30 can be inserted into the through hole 29 and the pushpin 30 can move up and down along the Z direction.

The pushpin 30 has a portion extending in the Z direction. The actuator part 31 supports this pushpin 30. The actuator part 31 is configured to generate a given pressure in the Z direction with the air supplied from a not-shown electro-pneumatic regulator. The drive part 32 supports the actuator part 31, and contains, for example, a motor inside so as to move the actuator part 31 in the Z direction.

In the above described upper chuck UC, the vacuum pump 13 is configured to reduce the air pressure in the edge area EA, middle area MA, and center area CA respectively by way of the suction ports 26, 27, and 28. With the reduction in the air pressure in each suction area and the external atmosphere being the atmospheric pressure, for example, the upper wafer UW is held toward the body part 20 side through vacuum suction. The control device 10 controls the vacuum pump 13 in a manner such that the vacuum suction of the wafer can been turned on and off independently in the center area CA, middle area MA, and edge area EA.

When the upper chuck UC holds an upper wafer UW, the rib 21 supports the peripheral portion of the top surface of the upper wafer UW, and the ribs 22, 23, 24 and pins 25 respectively support portions of the top surface of the upper wafer UW. With the top surface of the upper wafer UW supported by the pins 25, the upper wafer UW is held flat, which can suppress a distortion (warping) of the upper wafer UW in the Z direction. In addition, adverse effects of particles remaining on the top surface of the upper wafer UW upon the flatness of the upper wafer UW that is being held can be suppressed. Furthermore, with the contact area of the upper chuck UC with the upper wafer UW being reduced, the upper wafer UW can easily come off the upper chuck UC when the vacuum suction of the upper wafer UW by the upper chuck UC is released.

In the above described striker unit SU, the actuator part 31 and drive part 32 are controlled by the control device 10 in such a manner that the pushpin 30 is moved up and down in the Z direction, and that the tip end of the pushpin 30 comes into contact with the center portion of the top surface of the upper wafer UW held by the upper chuck UC. The control device 10 can thereby control the weight of the pushpin 30 pushing the center portion of the upper wafer UW. The pushpin 30 may be referred to as a "striker". The outer diameter D1 of the tip end of the pushpin 30 (i.e., a portion of the pushpin 30 brought into contact with the top surface of the upper wafer UW) is designed to be within the range from 1.0 to 10.0 millimeters.

(Configuration of Lower Chuck LC)

Figure 4:
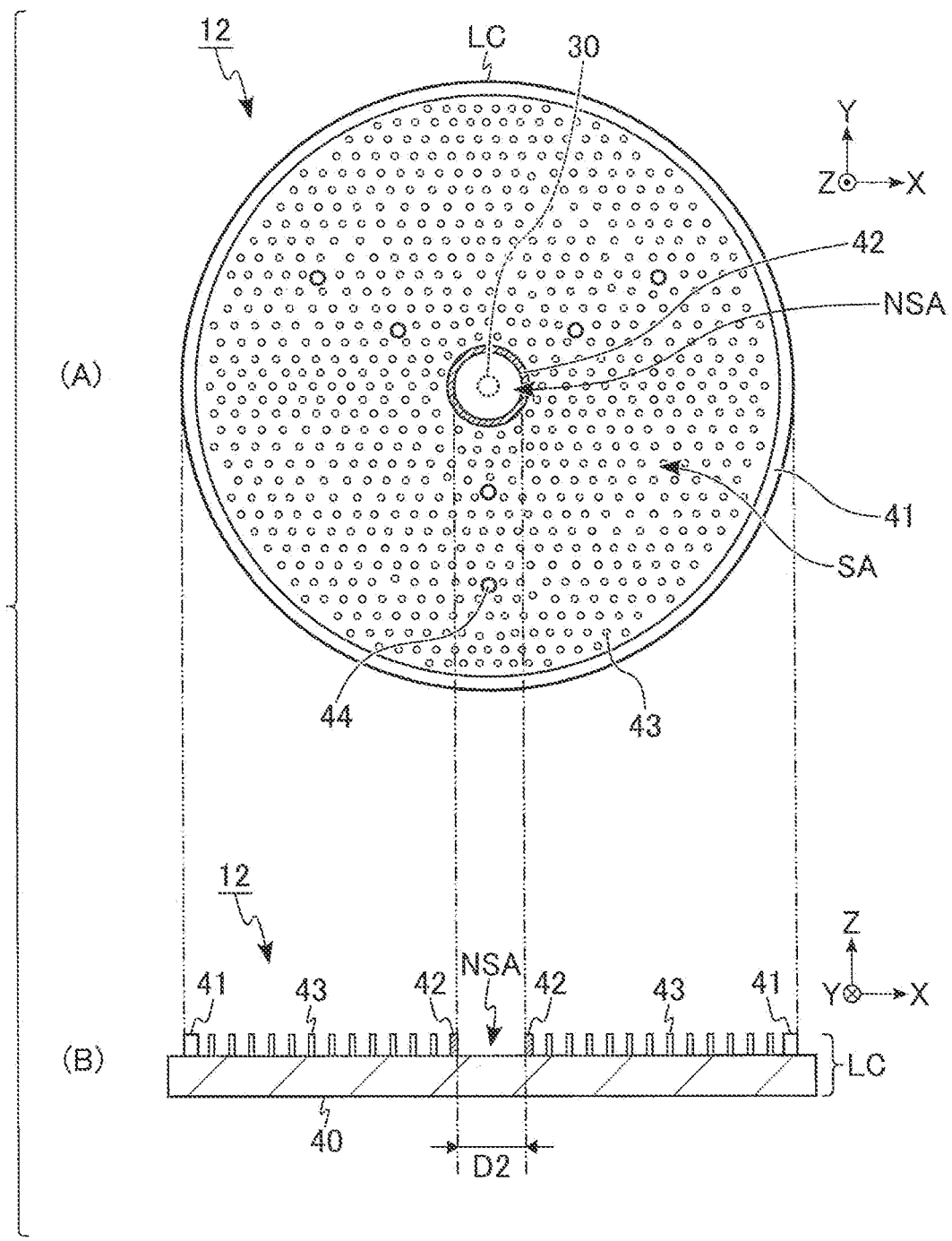
FIG. 4 is a schematic diagram showing an exemplary configuration of a lower chuck included in the bonding apparatus according to the first embodiment.

FIG. 4 is a schematic diagram showing an exemplary configuration of the lower chuck LC included in the bonding apparatus 1 according to the first embodiment. (A) in FIG. 4 is a planar layout of the lower chuck LC in the first embodiment, showing the portion where the pushpin 30 is placed in the bonding process. (B) in FIG. 4 shows the cross-sectional structure of the lower chuck LC in the first embodiment. As illustrated in FIG. 4, the lower chuck LC has a body part 40, and in the plane view, the diameter of the body part 40 is larger than that of the lower wafer LW. In the body part 40, ribs 41 and 42, a plurality of pins 43, and a plurality of suction ports 44 are provided.

The ribs 41 and 42, and pins 43 are provided on the top surface of the body part 40. The top surface of the body part 40 serves as the holding surface of the lower chuck LC. The ribs 41 and 42, and pins 43 have approximately the same height. The ribs 41 and 42 are concentrically arranged. Specifically, each of the ribs 41 and 42 is circularly formed. The rib 41 is arranged in the peripheral portion of the body part 40, and the inner diameter D2 of the rib 42 is smaller than the rib 41 and is larger than the outer diameter D1 of the tip end of the pushpin 30. The inner diameter D2 of the rib 42 is designed within a range from 1.0 to 15.0 millimeters.

Hereinafter, an area between the ribs 41 and 42 will be referred to as a "suction area SA". The suction area SA may be divided, or may take some other shape. The area surrounded by the rib 42 will be referred to as a "non-suction area NSA". The rib 42 may be referred to as a "partition wall portion". The shape of the rib 42 is not limited to a circle. The rib 42 will suffice as long as it can encircle, on the plane view, the portion where the pushpin 30 overlaps in the bonding process.

The pins 43 are arranged entirely over the suction area SA and are separated from each other. The arrangement of pins 43 may be suitably designed. Each of the suction ports 44 is connected to the top surface of the lower chuck LC. The suction ports 44 are connected to the vacuum pump 13. If the suction area SA is divided into multiple areas by the ribs, at least one suction port may be provided for every suction area. If the suction area SA is divided into multiple areas by the ribs, the lower chuck LC and vacuum pump 13 may be designed to vacuum each divided area.

In other words, the lower chuck LC is designed such that a plurality of pins 25 are arranged at intervals in the suction area SA on the top surface of the lower chuck LC that faces the upper chuck UC. On the other hand, the lower chuck LC is designed such that no pin 25 is arranged in the area (non-suction area NSA) where the tip end of the pushpin 30 overlaps in the plane view of the non-suction area NSA.

In the above described lower chuck LC, the vacuum pump 13 is configured to reduce the air pressure in the suction area SA by way of the suction ports 44. With the reduction in the air pressure of the suction area SA and the external atmosphere being, for example, atmospheric pressure, the lower wafer LW is vacuumed and held toward the body part 40 side. On the other hand, with the non-suction area NSA open to the atmosphere, the atmospheric pressure is maintained. For this reason, the portion of the lower wafer LW in contact with the non-suction area NSA is not held on the body part 40 side. That is, the lower chuck LC is designed to not vacuum the portion of the lower wafer LW located directly under the striker (pushpin 30) and to become hollow (e.g. atmospheric pressure) without being supported by the pin.

When the lower chuck LC holds the lower wafer LW, the rib 41 supports the peripheral portion of the bottom surface of the lower wafer LW, while the rib 42 and pins 43 support the corresponding portions of the bottom surface of the lower wafer LW. With the bottom surface of the lower wafer LW supported by the multiple pins 43, the lower wafer LW can be held flat, which can suppress a distortion (warping) of the lower wafer LW in the Z direction. In addition, the adverse effect of particles remaining on the bottom surface of the lower wafer LW upon the flatness of the lower wafer LW that is being held can be suppressed. Furthermore, with the contact area of the lower chuck LC with the lower wafer LW being reduced, the lower wafer LW can easily come off the lower chuck LC when the vacuum suction of the lower wafer LW by the lower chuck LC is released.

[1-3] Bonding Process

FIG. 5 is a flowchart showing an exemplary bonding process performed by the bonding apparatus 1 according to the first embodiment. By referring to FIG. 5, an exemplary bonding process will be explained below as a bonding method performed by the bonding apparatus 1 according to the first embodiment. Note that, in this specification, "inwardly" and "outwardly" are based on the position of a chuck holding a wafer. That is, the bonding surface side of the wafer corresponds to an outside.

Upon receipt of an upper wafer UW and a lower wafer LW each having a hydrophilic bonding surface, the bonding apparatus 1 initiates the bonding process (Start).

First, the control device 10 performs control such that the upper wafer UW is held by the upper chuck UC (S1). To be more specific, the bonding surface of the upper wafer UW, when received by the carrier device 14, faces upward. The carrier device 14 therefore flips the upper wafer UW so as to have the bonding surface of the upper wafer UW face downward. Then, the carrier device 14 carries the flipped upper wafer UW to underneath the upper chuck UC. Thereafter, the control device 10 activates the vacuum pump 13 to reduce the air pressures in the center area CA, middle area MA, and edge area EA of the upper chuck UC so that the upper chuck UC (upper stage 11) can hold the top surface of the upper wafer UW through vacuum suction.

Next, the control device 10 performs control such that the lower wafer LW is held by the lower chuck LC (S2). Specifically, since the bonding surface of the lower wafer LW, when received by the carrier device 14, faces upward, the carrier device 14 carries the lower wafer LW toward and above the lower chuck LC, without flipping the lower wafer LW. Thereafter, the control device 10 activates the vacuum pump 13 to reduce the air pressure in the suction area SA of the lower chuck LC so that the lower chuck LC (lower stage 12) can hold the bottom surface of the lower wafer LW through vacuum suction. The order of operations at S1 and S2 may be switched, or the operations at S1 and at S2 may be executed in parallel.

Next, the control device 10 places the upper wafer UW and lower wafer LW in such a manner as to face each other (S3). Specifically, the control device 10 adjusts the position of the upper stage 11 holding the upper wafer UW and the position of the lower stage 12 holding the lower wafer LW in such a manner that the upper wafer UW and lower wafer LW will face each other. For instance, the control device 10 may take an image of at least one alignment mark on the bonding surface of the upper wafer UW and on the bonding surface of the lower wafer LW, and adjusts the overlaying position of the upper wafer UW and lower wafer LW based on the imaging result. The structure for taking an image of an alignment mark may be provided in each of the upper stage 11 and lower stage 12, or in some other portion of the bonding apparatus 1. The distance between the facing upper wafer UW and lower wafer LW is adjusted in the later described operation at S5 to such a length that the upper wafer UW and lower wafer LW can be in contact with each other and bonded with each other.

Next, the control device 10 releases the vacuum suction in the center area CA of the upper chuck UC (4). Specifically, the control device 10 controls the vacuum pump 13 to stop the decompression (reducing the air pressure) in the center area CA of the upper chuck UC. Here, with the decompression being maintained in the middle area MA and edge area EA of the upper chuck UC, the vacuum suction of the upper wafer UW in the middle area MA and edge area EA is maintained. That is, the upper wafer UW is held by the middle area MA and edge area EA of the upper chuck UC.

Next, the control device 10 lowers the pushpin 30 to press the center portion of the upper wafer UW against the center portion of the lower wafer LW (S5). Specifically, the control device 10 controls the actuator part 31 and drive part 32 to lower the pushpin 30 so that the tip end of the pushpin 30 presses down the center portion of the top surface of the upper wafer UW. Here, the actuator part 31 applies a predetermined pressing pressure to the upper wafer UW by way of the pushpin 30 with the air supplied from the electropneumatic regulator. This deforms the center portion of the upper wafer UW, bringing the center portion of the upper wafer UW and the center portion of the lower wafer LW into contact with each other and pressing the portions against each other. Then, bonding begins between the pressed center portion of the upper wafer UW and center portion of the lower wafer LW. In brief, a Van der Waals force (intermolecular force) is created between the reformed bonding surface of the upper wafer UW and the reformed bonding surface of the lower wafer LW so that the contact portions of the upper wafer UW and lower wafer LW can be bonded. Furthermore, because the bonding surfaces of the upper wafer UW and lower wafer LW are both hydrophilically treated, hydrogen bonding (intermolecular force) is established between the hydrophilic groups in the contact portions of the upper wafer UW and lower wafer LW, which further tightens the bonding of the contact portions of the upper wafer UW and lower wafer LW.

Next, the control device 10 releases the vacuum suction in the middle area MA of the upper chuck UC (S6). Specifically, the control device 10 controls the vacuum pump 13 to stop the decompression (reducing the air pressure) in the middle area MA of the upper chuck UC. Here, with the decompression being maintained in the edge area EA of the upper chuck UC, the vacuum suction of the upper wafer UW is maintained in the edge area EA. That is, the upper wafer UW is held by the edge area EA of the upper chuck UC. Then, the portion of the upper wafer UW held by the middle area MA of the upper chuck UC gradually comes off the center area CA side and falls, coming into contact with the top surface of the lower wafer LW. As a result, the portions of the upper wafer UW and lower wafer LW respectively corresponding to the middle area MA are bonded together by the intermolecular force in the same manner as in the operation at S5.

Next, the control device 10 releases the vacuum suction in the edge area EA of the upper chuck UC (S7). Specifically, the control device 10 controls the vacuum pump 13 to stop reducing the air pressure in the edge area EA of the upper chuck UC. Then, the portion of the upper wafer UW held by the edge area EA of the upper chuck UC gradually comes off the center area CA side and falls, coming into contact with the top surface of the lower wafer LW. As a result, the portions of the upper wafer UW and lower wafer LW respectively corresponding to the edge area EA are bonded together by the intermolecular force in the same manner as in the operation at S5. When the operation at S7 is completed, the entire bonding surfaces of the upper wafer UW and lower wafer LW are bonded, forming a bonded wafer BW.

Next, the control device 10 pulls up the pushpin 30, and releases the vacuum suction of the lower chuck LC (S8). Specifically, the control device 10 controls the actuator part 31 and drive part 32 to pull up the pushpin 30, thereby moving the tip end of the pushpin 30 away from the top surface of the upper wafer UW. The control device 10 further controls the vacuum pump 13 to stop reducing the air pressure in the suction area SA of the lower chuck LC. This makes it easy for the bottom surface of the lower wafer LW, or in other words the bottom surface of the bonded wafer BW, to come off the lower chuck LC.

Upon the completion of the operation at S8, the control device 10 controls the carrier device 14 to carry the bonded wafer BW on the lower chuck LC to the outside, and terminates the series of operations in FIG. 5 (End).

(Bonding Process According to Comparative Example)

FIG. 6 is a schematic diagram showing an exemplary bonding process performed by a bonding apparatus according to a comparative example. (A), (B), (C) and (D) in FIG. 6 respectively show the state of the upper stage 11 and lower stage 12 arranged to face each other, and the state of the upper wafer UW and lower wafer LW after being processed at different steps of the bonding process according to the comparative example. The bonding apparatus according to the comparative example differs from the first embodiment only in the configuration of the lower chuck LC. Specifically, a partition wall portion, which is included in the lower chuck LC according to the first embodiment, is omitted from the lower chuck LC according to the comparative example, and a plurality of pins 43 are arranged in the center portion. By referring to FIG. 6, an exemplary bonding process according to the comparative example will be explained below.

Upon the implementation of the operations at S1 to S3 of FIG. 5 by the bonding apparatus according to the comparative example, the upper wafer UW is held by the upper chuck UC through vacuum suction, and the lower wafer LW is held by the lower chuck LC through vacuum suction in such a manner that the upper wafer UW and lower wafer LW are positioned to face each other, as illustrated in (A) of FIG. 6. According to the comparative example, the bottom surface of the lower wafer LW is entirely vacuumed and held by the pins 43.

Upon the implementation of the operations at S4 and S5 in FIG. 5 by the bonding apparatus according to the comparative example, the vacuum suction of the center area CA is released and the pushpin 30 is lowered. As a result, in (B) of FIG. 6, the center portion of the upper wafer UW is outwardly deformed under the pressure from the tip end of the pushpin 30, and the outwardly deformed portion (convex portion) is pressed against the center portion of the lower wafer LW. Here, the center portion of the upper wafer UW is deformed along the tip end of the pushpin 30, producing a distortion. On the other hand, the portion of the lower wafer LW being pressed by way of the upper wafer UW is being supported by the pins 43 through the vacuum suction of the lower chuck LC. The deformation of the center portion of the lower wafer LW therefore can be suppressed in the operation at S5 according to the comparative example.

Upon the implementation of the operation at S6 in FIG. 5 by the bonding apparatus according to the comparative example, the vacuum suction of the middle area MA is released, as a result of which the portion of the upper wafer UW vacuumed and held at the middle area MA comes off the center area CA side. Then, as illustrated in (C) of FIG. 6, covalent bonding between the bonding surface of the upper wafer UW and the bonding surface of the lower wafer LW progresses from the center area CA side.

Upon the implementation of the operation at S7 by the bonding apparatus according to the comparative example, the vacuum suction of the edge area EA is released, as a result of which the portion of the upper wafer UW vacuumed and held at the edge area EA comes off the middle area MA side. Then, covalent bonding between the bonding surface of the upper wafer UW and the bonding surface of the lower wafer LW progresses from the center area CA side. Consequently, the bonding surface of the upper wafer UW and the bonding surface of the lower wafer LW are entirely bonded to form a bonded wafer BW, as illustrated in (D) of FIG. 6.

Bonding Process in First Embodiment

Figure 7:
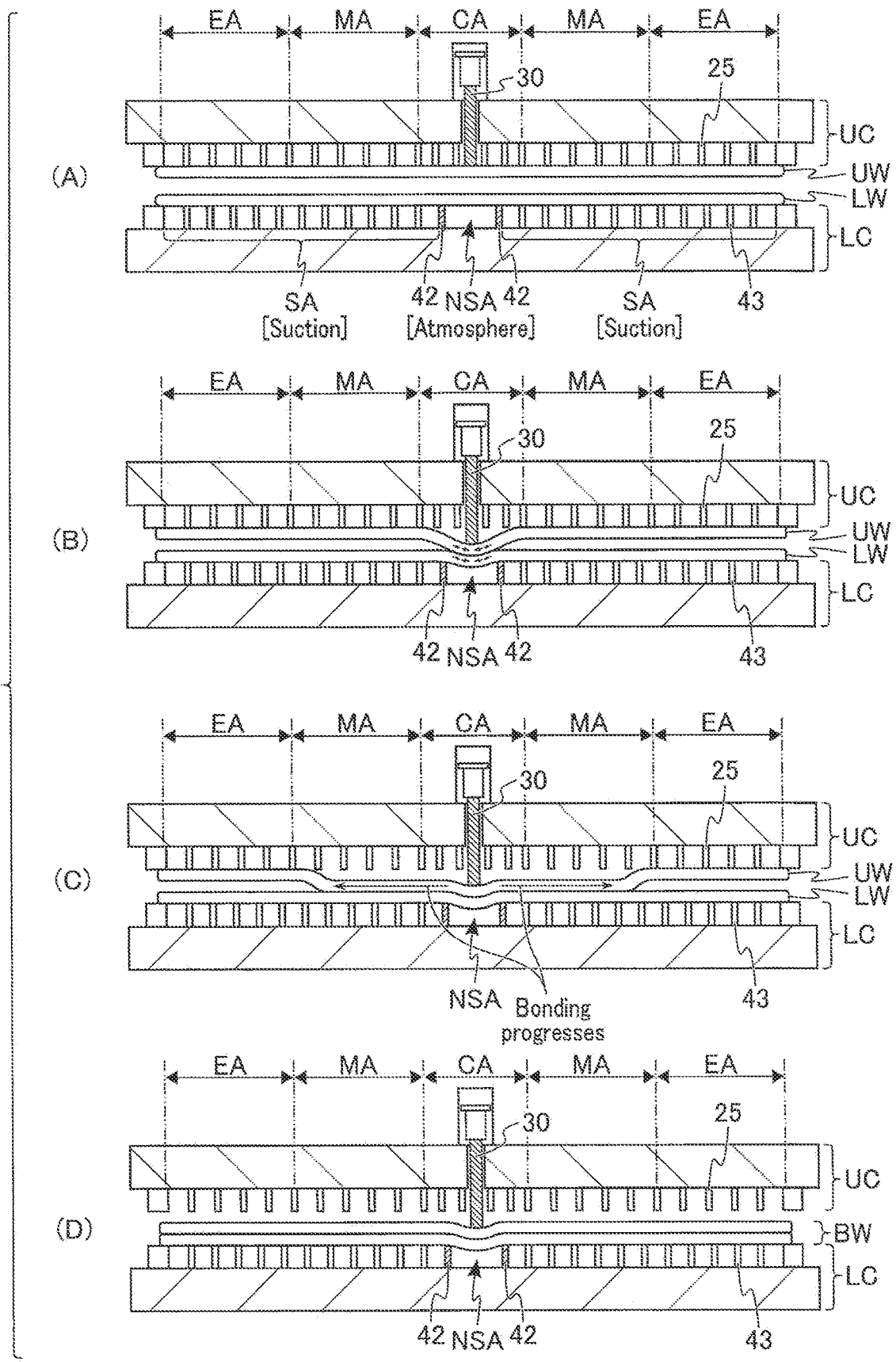
FIG. 7 is a schematic diagram showing an exemplary bonding process performed by the bonding apparatus according to the first embodiment.

FIG. 7 is a schematic diagram showing an exemplary bonding process performed by the bonding apparatus 1 according to the first embodiment. (A), (B), (C) and (D) in FIG. 7 respectively show the states of the upper stage 11 and lower stage 12 arranged to face each other, and the states of the upper wafer UW and lower wafer LW after being processed at different steps of the bonding process according to the first embodiment. By referring to FIG. 7, an exemplary bonding process will be explained below as a bonding method performed by the bonding apparatus 1 according to the first embodiment.

Upon the implementation of the operations at S1 to S3 of FIG. 5 by the bonding apparatus 1 according to the first embodiment, the upper wafer UW is held by the upper chuck UC through vacuum suction, and the lower wafer LW is held by the lower chuck LC through vacuum suction in such a manner that the upper wafer UW and lower wafer LW are positioned to face each other, as illustrated in (A) of FIG. 7. According to the first embodiment, the bottom surface of the lower wafer LW is vacuumed and held in the suction area SA, but not vacuumed or held in the non-suction area NSA encircled by the rib 42 (partition wall portion). The non-suction area, which is not vacuumed, is maintained under atmospheric pressure, for example. Thus, according to the first embodiment, the portion of the bottom surface of the lower wafer LW that faces the suction area SA is supported by multiple pins 43 and the like, while the portion that faces the non-suction area NSA is not supported by pins 43 and the like.

Upon the implementation of the operations at S4 and S5 in FIG. 5 by the bonding apparatus 1 according to the first embodiment, the vacuum suction of the center area CA is released, and the pushpin 30 is lowered. Then, as illustrated in (B) of FIG. 7, the center portion of the upper wafer UW is outwardly deformed under the pressure from the pushpin 30, and the outwardly deformed portion (convex portion) is pressed against the center portion of the lower wafer LW. Here, the center portion of the upper wafer UW is deformed along the tip end of the pushpin 30, producing a distortion. Because the portion of the lower wafer LW to which pressure is applied by way of the upper wafer UW is not supported by the pins 43 or the like, this portion is also deformed along the shape of the deformed portion of the upper wafer UW, producing a distortion. In other words, in the operation at S5 of the first embodiment, the center portion of the lower wafer LW is inwardly deformed along with the outwardly deformed center portion of the upper wafer UW.

Upon the implementation of the operation at S6 in FIG. 5 by the bonding apparatus 1 according to the first embodiment, the vacuum suction of the middle area MA is released, as a result of which the portion of the upper wafer UW vacuumed and held at the middle area MA comes off the center area CA side. As illustrated in (C) of FIG. 7, covalent bonding between the bonding surface of the upper wafer UW and the bonding surface of the lower wafer LW progresses from the center area CA side.

Upon the implementation of the operation at S7 in FIG. 5 by the bonding apparatus 1 according to the first embodiment, the vacuum suction of the edge area EA is released, as a result of which the portion of the upper wafer UW vacuumed and held at the edge area EA comes off the middle area MA side. Then, covalent bonding between the bonding surface of the upper wafer UW and the bonding surface of the lower wafer LW progresses from the center area CA side. Consequently, the bonding surface of the upper wafer UW and the bonding surface of the lower wafer LW are entirely bonded to form a bonded wafer BW, as illustrated in (D) of FIG. 7.

[1-4] Effects of First Embodiment

As described above, under an impact on the upper wafer UW from the striker (pushpin 30), the bonding apparatus initiates bonding between the upper wafer UW and the lower wafer LW. Under the impact of the striker, however, the center portion of the upper wafer UW may be locally distorted. As in the bonding apparatus according to the comparative example, where the lower wafer LW is held by the entire surface of the lower chuck LC including the center portion through vacuum suction, a distortion in the center portion of the lower wafer LW facing the center portion of the upper wafer UW is suppressed when the structure is pressed by the striker. As a result, in the comparative example, the center portion of the upper wafer UW and the center portion of the lower wafer LW are bonded with a displacement in overlaying, which may produce a displacement-related defect in semiconductor devices arranged in the center portion of the bonded wafer BW.

In contrast, the bonding apparatus 1 according to the first embodiment, in which a non-suction area NSA is provided in the lower chuck LC, inwardly deforms the lower wafer LW along with the upper wafer UW outwardly deformed by the striker. Thus, the bonding apparatus 1 according to the first embodiment can reduce the displacement in overlaying of the upper wafer UW and lower wafer LW at the center portion of the bonded wafer BW. Consequently, the bonding apparatus 1 according to the first embodiment can suppress defects that may be incurred by a displacement in overlaying at the center portion of the bonded wafer BW, improving yield of semiconductor devices.

[2] Second Embodiment

A bonding apparatus 1 according to the second embodiment has a configuration similar to that of the first embodiment, except for the lower chuck LC holding the center portion of the lower wafer LW in an inwardly distorted manner through vacuum suction. The bonding apparatus 1 according to the second embodiment may implement a bonding process similar to that of the first embodiment. The following explanation of the bonding apparatus 1 according to the second embodiment will focus on differences with respect to the first embodiment.

[2-1] Configuration of Lower Chuck LCa

Figure 8:
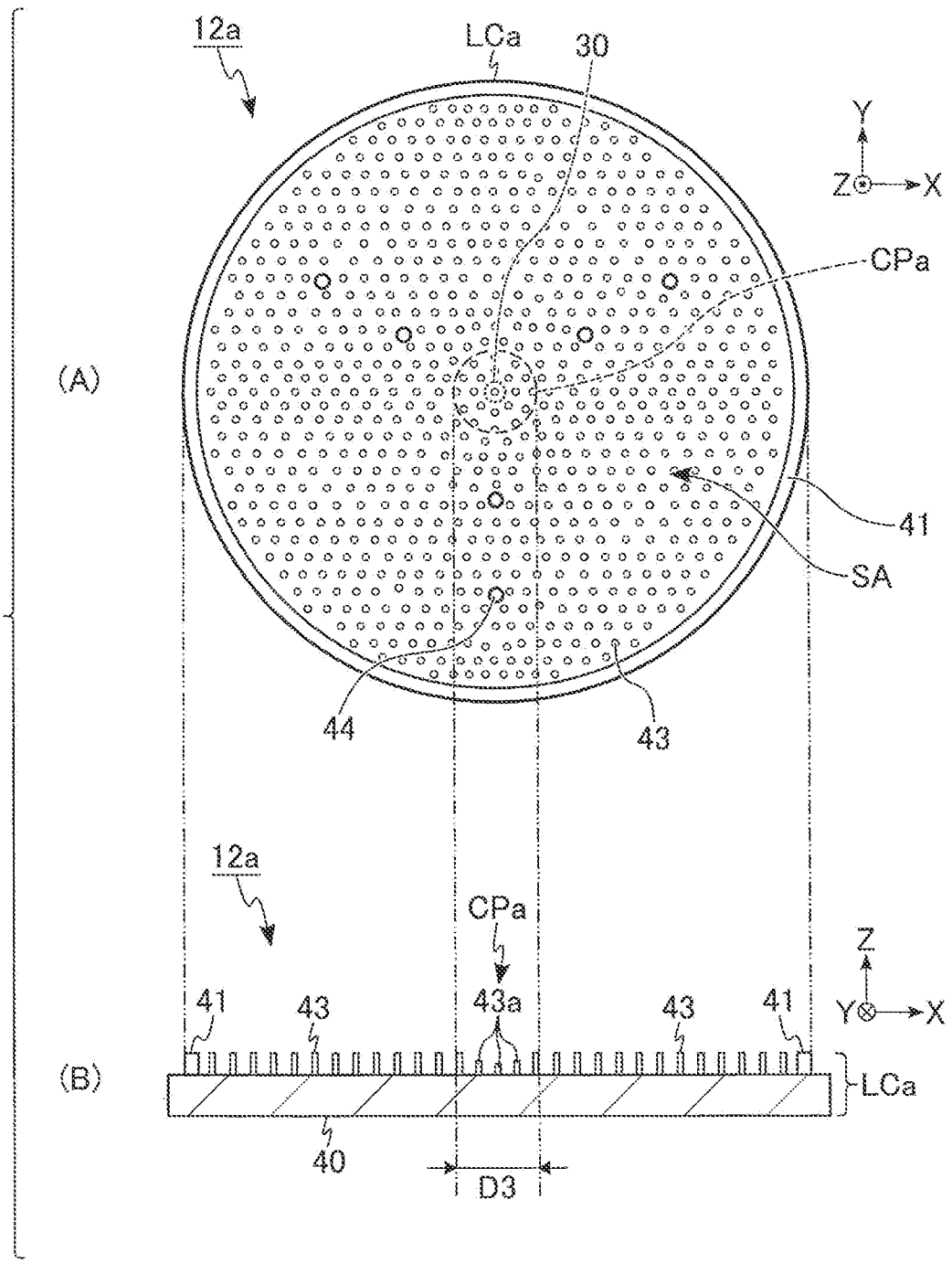
FIG. 8 is a schematic diagram showing an exemplary configuration of a lower chuck included in a bonding apparatus according to the second embodiment.

FIG. 8 is a schematic diagram showing the configuration of a lower chuck LCa included in a bonding apparatus 1 according to the second embodiment. (A) in FIG. 8 shows a planar layout of the lower chuck LCa, and (B) in FIG. 8 shows a cross-sectional structure of the lower chuck LCa. As illustrated in FIG. 8, the lower chuck LCa does not include a rib 42 as in the lower chuck LC according to the first embodiment, and includes additional pins 43a. Hereinafter, the center portion of the lower chuck LCa in the plane view will be referred to as a "center portion CPa".

The suction area SA of the lower chuck LCa includes the center portion CPa, and is provided entirely in the area encircled by the rib 41. The center portion CPa is provided in the area that faces the center area CA explained in the first embodiment. If the center portion CPa corresponds to an encircled area, the diameter D3 of the center portion CPa is designed, for example, in the range from 1.0 to 15.0 millimeters.

A plurality of pins 43a are arranged in the center portion CPa. The height of each of the pins 43a is designed to be lower than the height of the pins 43 in the peripheral area around the center portion CPa (i.e., the area between the center portion CPa and the rib 41). Furthermore, the heights of the pins 43a are designed, for example, to be higher toward the outer perimeter of the lower chuck LCa from the portion overlapping the pushpin 30 in the plane view. That is, the pins 43a in the center portion CPa have a smaller height as the pins 43a become closer to the center of the center portion CPa in the plane view. To be more specific, the heights of the pins 43a are determined such that the amount of distortion caused by the pushpin 30 in the center portion of the upper wafer UW in the bonding process (i.e., the amount of inward deformation in the center portion of the upper wafer UW) will be approximately the same as the amount of distortion caused in the center portion of the lower wafer LW held by the lower chuck LCa through vacuum suction (i.e., the amount of inward deformation in the center portion of the lower wafer LW held along the center portion Cpa).

The rest of the configuration of the bonding apparatus 1 according to the second embodiment is the same as that of the first embodiment.

[2-2] Bonding Process in Second Embodiment

FIG. 9 is a schematic diagram showing an exemplary bonding process performed by the bonding apparatus 1 according to the second embodiment. (A), (B) and (C) in FIG. 9 respectively show the states of the upper stage 11 and lower stage 12 arranged to face each other, and the states of the upper wafer UW and lower wafer LW after being processed at different steps of the bonding process according to the second embodiment. By referring to FIG. 9, an exemplary bonding process will be explained below as a bonding method performed by the bonding apparatus 1 according to the second embodiment.

Upon the implementation of the operations at S1 to S3 of FIG. 5 by the bonding apparatus 1 according to the second embodiment, the upper wafer UW is held by the upper chuck UC through vacuum suction, and the lower wafer LW is held by the lower chuck LC through vacuum suction in such a manner that the upper wafer UW and lower wafer LW are positioned to face each other, as illustrated in (A) of FIG. 9. The lower chuck LC according to the second embodiment holds the entire surface of the lower wafer LW through vacuum suction. With the pins 43a in the center portion Cpa of the lower wafer LW being shorter than the pins 43 in the rest of the lower wafer LW, the center portion of the lower wafer LW is inwardly deformed through vacuum suction and supported by the pins 43a. In other words, according to the second embodiment, inward deformation occurs in the center portion of the lower wafer LW when the lower chuck LC comes to hold the lower wafer LW.

Upon the implementation of the operations at S4 and S5 in FIG. 5 by the bonding apparatus 1 according to the second embodiment, the vacuum suction of the center area CA is released, and the pushpin 30 is lowered. Then, as illustrated in (B) of FIG. 9, the center portion of the upper wafer UW becomes outwardly deformed under the pressure applied by the tip end of the pushpin 30, and the outwardly deformed portion (convex portion) is pressed against the (inwardly deformed) center portion of the lower wafer LW. Here, the center portion of the upper wafer UW is deformed along the shape of the tip end of the pushpin 30, producing a distortion. On the other hand, the portion of the lower wafer LW being pressed by way of the upper wafer UW is being supported by the pins 43a through the vacuum suction of the lower chuck LC. As a result, the deformation of the center portion of the lower wafer LW can be suppressed in the operation at S5 according to the second embodiment.

Upon the implementation of the operations at S6 and S7 of FIG. 5 by the bonding apparatus 1 according to the second embodiment, the vacuum suction of the middle area MA and edge area EA is released, as a result of which the portion of the upper wafer UW vacuumed and held at the middle area MA and edge area EA comes off the center area CA side. Then, in a manner similar to the first embodiment, covalent bonding between the bonding surface of the upper wafer UW and the bonding surface of the lower wafer LW progresses from the center area CA side. Consequently, the bonding surface of the upper wafer UW and the bonding surface of the lower wafer LW are entirely bonded to form a bonded wafer BW, as illustrated in (C) of FIG. 9.

[2-3] Effects of Second Embodiment

As described above, the bonding apparatus 1 according to the second embodiment inwardly deforms the center portion of the lower wafer LW when the lower chuck LC comes to hold the lower wafer LW. The amount of this inward deformation in the lower wafer LW is adjusted to be approximately the same as the amount of inward deformation caused in the center portion of the upper wafer UW upon an impact of the striker.

Thus, the bonding apparatus 1 according to the second embodiment can reduce the displacement in overlaying of the upper wafer UW and lower wafer LW at the center portion of the bonded wafer BW, in the same manner as in the first embodiment. Consequently, the bonding apparatus 1 according to the second embodiment can suppress defects that may be incurred by a displacement in overlaying at the center portion of the bonded wafer BW, improving yield of semiconductor devices, in the same manner as in the first embodiment.

[3] Third Embodiment

The bonding apparatus 1 according to the third embodiment has a configuration similar to that of the first embodiment, except for the lower chuck LC outwardly deforming and holding the center portion of the lower wafer LW through vacuum suction. The bonding apparatus 1 according to the third embodiment may implement a bonding process similar to that of the first embodiment. The following explanation of the bonding apparatus 1 according to the third embodiment will focus on differences with respect to the first embodiment.

[3-1] Configuration of Lower Chuck LCb

Figure 10:
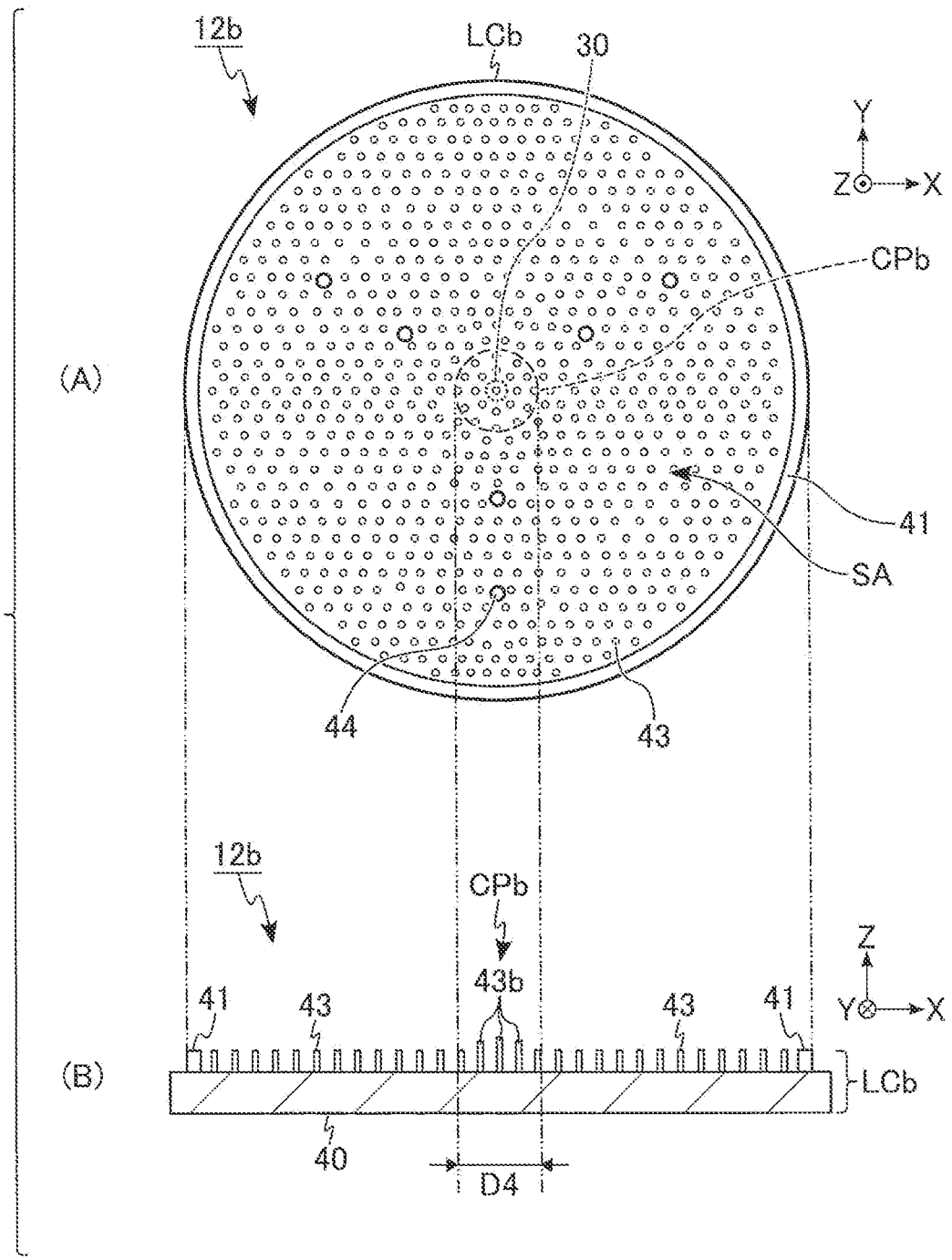
FIG. 10 is a schematic diagram showing an exemplary configuration of a lower chuck included in a bonding apparatus 1 according to the third embodiment.

FIG. 10 is a schematic diagram showing an exemplary configuration of a lower chuck LCb included in a bonding apparatus 1 according to the third embodiment. (A) in FIG. 10 shows a planar layout of the lower chuck LCb, and (B) in FIG. 10 shows a cross-sectional structure of the lower chuck LCb. As illustrated in FIG. 10, the lower chuck LCb does not include a rib 42, which is included in the lower chuck LC according to the first embodiment, while the lower chuck LCb includes additional pins 43b. Hereinafter, the center portion of the lower chuck LCb in the plane view will be referred to as a "center portion CPb".

The suction area SA of the lower chuck LCb includes the center portion CPb, and is provided entirely in the area encircled by the rib 41. The center portion CPb is provided in the area that faces the center area CA explained in the first embodiment. When the center portion CPb corresponds to an encircled area, the diameter D4 of the center portion CPb is designed to be in the range from 1.0 to 15.0 millimeters.

A plurality of pins 43b are arranged in the center portion CPb. The height of each of the pins 43b is designed to be greater than the height of the pins 43 in the peripheral area outside the center portion CPb (i.e., in the area between the center portion CPb and the rib 41). Furthermore, the heights of the pins 43b are designed, for example, to be lower toward the outer perimeter of the lower chuck LCb from the portion overlapping the pushpin 30 in the plane view. That is, the pins 43b in the center portion CPb have a greater height as the pins 43b become closer to the center of the center portion CPb in the plane view. To be more specific, the heights of the pins 43b are determined such that the amount of distortion caused by the pushpin 30 in the center portion of the upper wafer UW in the bonding process (i.e., the amount of inward deformation in the center portion of the upper wafer UW) will be approximately the same as the amount of distortion caused in the center portion of the lower wafer LW held by the lower chuck LCb through vacuum suction (i.e., the amount of outward deformation in the center portion of the lower wafer LW held along the center portion CPb).

The rest of the configuration of the bonding apparatus 1 according to the third embodiment is the same as that of the first embodiment.

[3-2] Bonding Process in Third Embodiment

Figure 11:
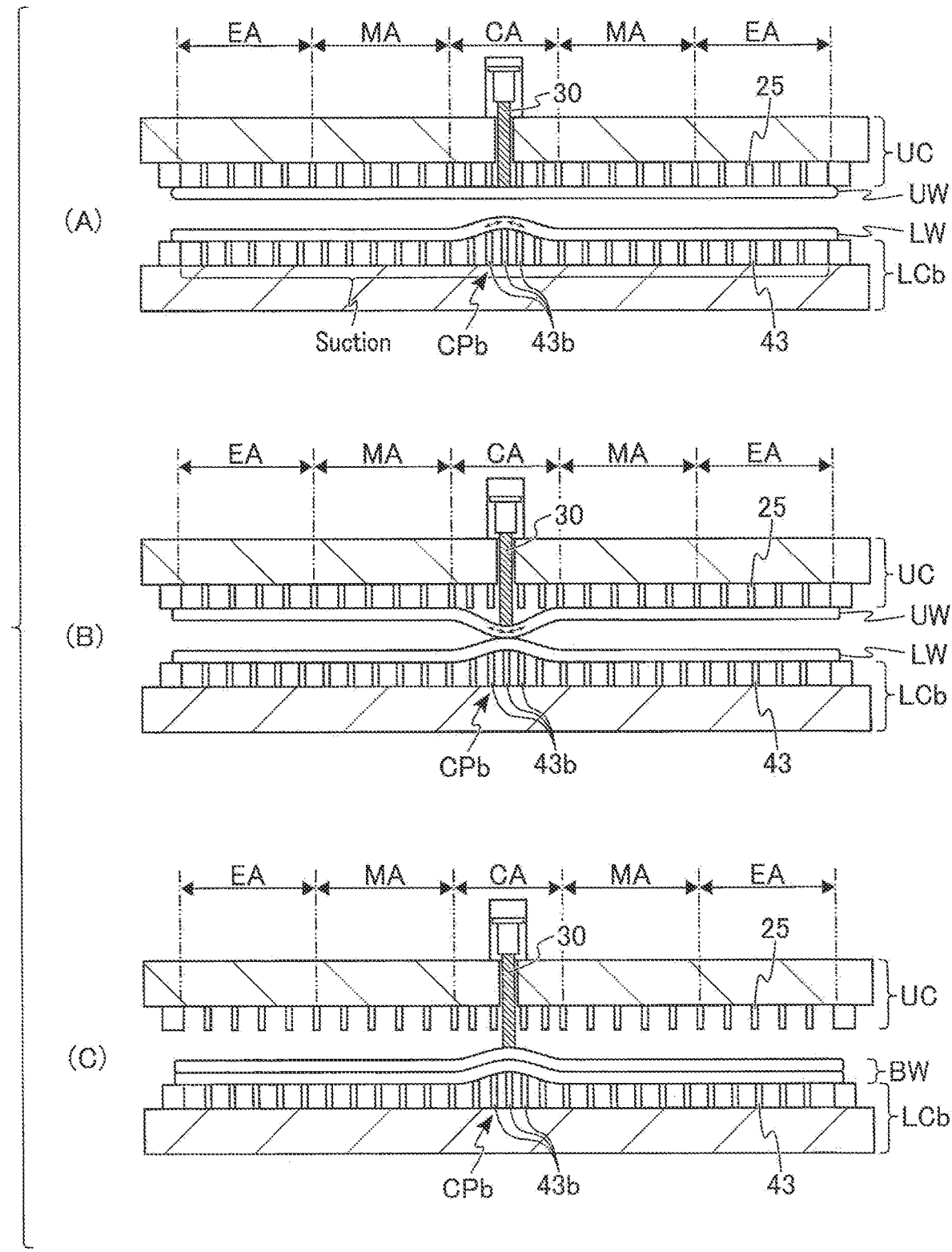
FIG. 11 is a schematic diagram showing an exemplary bonding process performed by the bonding apparatus according to the third embodiment.

FIG. 11 is a schematic diagram showing an exemplary bonding process performed by the bonding apparatus 1 according to the third embodiment. (A), (B) and (C) in FIG. 11 show the states of the upper stage 11 and lower stage 12 arranged to face each other, and the states of the upper wafer UW and lower wafer LW after being processed at different steps of the bonding process according to the third embodiment. By referring to FIG. 11, an exemplary bonding process will be explained below as a bonding method performed by the bonding apparatus 1 according to the third embodiment.

Upon the implementation of the operations at S1 to S3 of FIG. 5 by the bonding apparatus 1 according to the third embodiment, the upper wafer UW is held by the upper chuck UC through vacuum suction, and the lower wafer LW is held by the lower chuck LC through vacuum suction in such a manner that the upper wafer UW and lower wafer LW are positioned to face each other, as illustrated in (A) of FIG. 11. The lower chuck LC according to the third embodiment holds the entire surface of the lower wafer LW through vacuum suction. With the pins 43b in the center portion CPb of the lower wafer LW taller than the pins 43 in the rest of the lower wafer LW, the center portion of the lower wafer LW is outwardly deformed through vacuum suction and supported by the pins 43b. In other words, according to the third embodiment, a distortion occurs in the center portion of the lower wafer LW when the lower chuck LC comes to hold the lower wafer LW.

Upon the implementation of the operations at S4 and S5 in FIG. 5 by the bonding apparatus 1 according to the third embodiment, the vacuum suction of the center area CA is released, and the pushpin 30 is lowered. Then, as illustrated in (B) of FIG. 11, the center portion of the upper wafer UW becomes outwardly deformed under the pressure applied by the tip end of the pushpin 30, and the outwardly deformed portion (convex portion) is pressed against the (outwardly deformed) center portion of the lower wafer LW. Here, the center portion of the upper wafer UW is deformed along the shape of the tip end of the pushpin 30, producing a distortion. On the other hand, the portion of the lower wafer LW being pressed by way of the upper wafer UW is in the state of being supported by the pins 43b through the vacuum suction of the lower chuck LC. As a result, the deformation of the center portion of the lower wafer LW can be suppressed in the operation at S5 according to the third embodiment.

Upon the implementation of the operations at S6 and S7 of FIG. 5 by the bonding apparatus 1 according to the third embodiment, the vacuum suction of the middle area MA and edge area EA is released, as a result of which the portion of the upper wafer UW vacuumed and held at the middle area MA and edge area EA comes off the center area CA side. Then, in a manner similar to the first embodiment, covalent bonding between the bonding surface of the upper wafer UW and the bonding surface of the lower wafer LW progresses from the center area CA side. Consequently, the bonding surface of the upper wafer UW and the bonding surface of the lower wafer LW are entirely bonded to form a bonded wafer BW, as illustrated in (C) of FIG. 11.

[3-3] Effects of Third Embodiment

As described above, the bonding apparatus 1 according to the third embodiment outwardly deforms the lower wafer LW at its center portion when the lower chuck LC comes to hold the lower wafer LW. The amount of this outward deformation in the lower wafer LW is adjusted so as to be approximately the same as the amount of inward deformation in the center portion of the upper wafer UW caused on an impact of the striker.

Thus, the bonding apparatus 1 according to the third embodiment can reduce the displacement in overlaying of the upper wafer UW and lower wafer LW in the center portion of the bonded wafer BW, in the same manner as in the first embodiment. Consequently, the bonding apparatus 1 according to the third embodiment can suppress defects that may be incurred by a displacement in overlaying at the center portion of the bonded wafer BW, improving yield of semiconductor devices, in the same manner as in the first embodiment.

[4] Others

The above embodiments can be modified in various manners.

Figure 12:
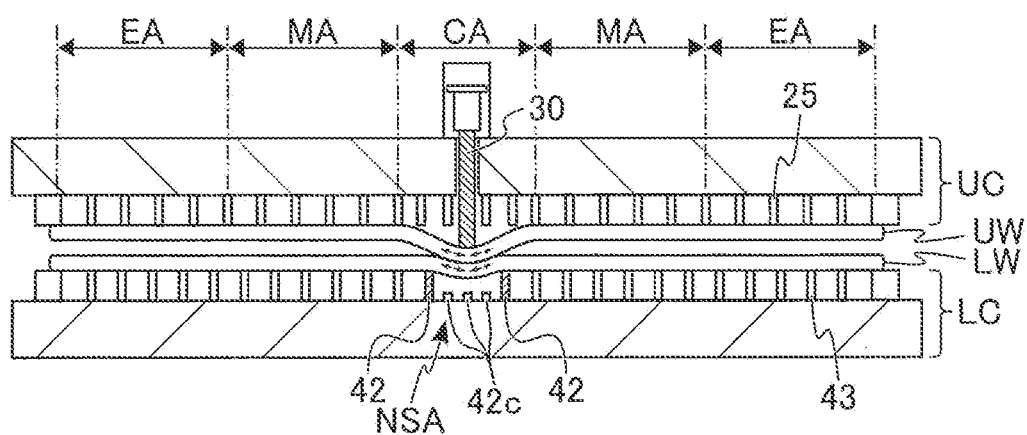
FIG. 12 is a schematic diagram showing an exemplary bonding process performed by a bonding apparatus according to a modification example of the first embodiment.

FIG. 12 is a schematic diagram showing an exemplary bonding process performed by a bonding apparatus 1 according to a modification example of the first embodiment, where an exemplary cross-sectional structure of the lower chuck LC included in the bonding apparatus 1 according to the modification example of the first embodiment is illustrated. As illustrated in FIG. 12, in the configuration of the lower chuck LC according to the modification example of the first embodiment, at least one pin 42c is added to the lower chuck LC of the first embodiment. The height of the pin 42c is designed so as to not be in contact with the center portion of the lower wafer LW when the pushpin 30 presses the center portion of the lower wafer LW by way of the upper wafer UW. That is, the lower chuck LC may include a pin 42c that is not configured to support the lower wafer LW.

Throughout the specification, the bonding apparatus 1 bonding two wafers has been described, which is not a limitation. Each of the lower wafer LW and upper wafer UW may be formed by multiple wafers bonded together. In other words, a bonded wafer formed by the bonding apparatus 1 may be constituted by three or more wafers bonded together.

Throughout the specification, each of the upper chuck UC and lower chuck LC is described as a pin chuck, but may be a chuck of a different type. It is preferable that the upper chuck UC be configured to release the vacuum suction sequentially from the inner portion of the upper wafer UW toward the outer portion thereof. The lower chuck LC will be sufficient as long as it has a structure similar to the partition wall portion SP or center portion CP. For instance, in the first embodiment, the lower chuck LC will be sufficient as long as it holds the outer portion of the partition wall portion SP in a plane view through vacuum suction without holding the inner portion thereof. In the second embodiment, the lower chuck LC will be sufficient as long as it includes a supporting member such that the portion of the lower wafer LW corresponding to the center portion CP can be inwardly deformed when the lower chuck LC vacuums and holds the wafer. In the third embodiment, the lower chuck LC will be sufficient as long as it includes a supporting member such that the portion of the lower wafer LW corresponding to the center portion CP can be outwardly deformed when the lower chuck LC vacuums and holds the lower wafer LW.

The "pins" and "ribs" in the upper chuck UC and lower chuck LC described in the specification may be formed by processing the body part. The "areas" may be regarded as structural components of the upper chuck UC or lower chuck LC. For instance, if the lower chuck LC is defined as including a suction area SA and a non-suction area NSA, the suction area SA and non-suction area NSA are determined to be different areas above the body part 40. The "height" is measured with reference to the body part 20 or 40. For a height reference, a structural component other than the body part 20 or 40 may be adopted. The "plane view" is an XY plane defined by the X direction and Y direction (plane parallel to the front surface of the body part 20 or 40) viewed from the Z direction. The "inner diameter" and "outer diameter" are calculated based on the dimensions measured in the plane view.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A bonding apparatus configured to perform a bonding process in which a first surface of a first substrate and a second surface of a second substrate are bonded to each other, the bonding apparatus comprising:
a first chuck configured to hold a third surface of the first substrate, which is a surface opposite the first surface of the first substrate;
a second chuck configured to hold a fourth surface of the second substrate, which is a surface opposite the second surface of the second substrate, the second chuck being configured to be arranged above the first chuck; and
a pushpin arranged in a center portion of the second chuck and having a tip end extending in a first direction, the pushpin being configured to move up and down in the first direction,
wherein:
the first chuck includes a first area and a second area in a plane view, the first chuck further includes a first rib arranged to divide the first area and the second area from each other in the plane view, the first area includes an area that overlaps the tip end of the pushpin in the plane view, and the second area encircles an outer perimeter of the first area in the plane view, and
the first chuck has a fifth surface facing the second chuck, the fifth surface of the first chuck has a plurality of pins arranged at intervals in the second area and has no pin in the first area, a diameter of the first area with no pin is greater than an outer diameter of the tip end of the pushpin in the plane view, and the first area includes an area that overlaps the tip end of the pushpin in the plane view such that a part of the first area is immediately opposite the pushpin along the first direction.

2. The bonding apparatus of claim 1, wherein:
the first chuck has a suction port connected to the fifth surface in the second area,
the bonding apparatus comprises a control device operably coupled to the suction port, and
the control device is configured to control the bonding apparatus such that when the first chuck holds the third surface of the first substrate, a portion of the fifth surface of the first chuck corresponding to the first area is opened to atmosphere, while a portion of the fifth surface of the first chuck corresponding to the second area is vacuumed through the suction port.

3. The bonding apparatus of claim 2, further comprising:
a vacuum pump connected to the suction port of the first chuck.

4. The bonding apparatus of claim 1, wherein:
the fifth surface of the first chuck includes a second rib configured to encircle each of the first area and the second area in the plane view, and
the outer diameter of the tip end of the pushpin is smaller than an inner diameter of the first rib in the plane view.

5. The bonding apparatus of claim 4, wherein:
the outer diameter of the tip end of the pushpin is within a range from 1.0 to 10.0 millimeters, and
the inner diameter of the first rib is within a range from 1.0 to 15.0 millimeters.

6. The bonding apparatus of claim 1, further comprising:
a control device configured to control the bonding process.

7. The bonding apparatus of claim 1, wherein a distance between an innermost pin among the plurality of pins and a center of the first area is greater than a distance between the outer diameter of the tip end of the pushpin and the center of the first area in the plane view.

8. The bonding apparatus of claim 1, wherein no suction port is provided in the first area.

9. The bonding apparatus of claim 1, wherein the diameter of the first area with no pin is greater than a distance between adjacent pins among the plurality of pins in the plane view.

10. The bonding apparatus of claim 1, wherein the first area includes a center of the first chuck.

* * * * *